United States Patent [19]

McCartney

[11] Patent Number: 5,563,597
[45] Date of Patent: Oct. 8, 1996

[54] SWITCHED-CAPACITOR ONE-BIT DIGITAL-TO-ANALOG CONVERTER WITH LOW SENSITIVITY TO OP-AMP OFFSET VOLTAGE

[75] Inventor: Damien McCartney, Limerick, Ireland

[73] Assignee: Analog Devices, Inc., Norwood, Mass.

[21] Appl. No.: 254,772

[22] Filed: Jun. 6, 1994

[51] Int. Cl.⁶ .............................. H03M 3/02; G06G 7/186
[52] U.S. Cl. ........................... 341/150; 341/143; 341/126
[58] Field of Search .................................... 341/150, 126, 341/143

[56] References Cited

U.S. PATENT DOCUMENTS 4,653,017 3/1987 Colbeck .................................. 364/825

FOREIGN PATENT DOCUMENTS 2642921 8/1990 France.
2256551 12/1992 United Kingdom.

OTHER PUBLICATIONS

Ribner, D. B. et al., "A third–order multistage sigma–delta modulator with reduced sensitivity to nonidealities", IEEE of Solid–State Circuits, 26(12):1764–1773 (Dec. 1991).
Comino, V. et al., "A first–order current–steering sigma–delta modulator", IEEE Journal of Solid–State Circuits, 26(3):176–182, (Mar. 1991).

Primary Examiner—Jeffrey A. Gaffin
Assistant Examiner—Peguy JeanPierre
Attorney, Agent, or Firm—Wolf, Greenfield & Sacks, P.C.

[57] ABSTRACT

A switched-capacitor DAC system includes an integrator circuit including an op amp having an input lead, an output lead and an integrator capacitor connected between the input lead and the output lead. A sampling switch is operable to connect an input capacitor to be charged by an input voltage during at least one of first and second non-overlapping time intervals, wherein the first time interval is subdivided into first and second non-overlapping sub-intervals and the second time interval is subdivided into third and fourth non-overlapping sub-intervals. A transferring switch is operable to connect the input capacitor to transfer charge from the input capacitor to transfer charge from the input capacitor to the integrator capacitor during at least one of the first and third sub-intervals. A discharging switch is operable to connect the input capacitor to a discharge node during at least one of the second and fourth sub-intervals. In a preferred embodiment of the present invention, the sampling switch connects the input capacitor during one of the first and second sub-intervals, the transferring switch connects the input capacitor during one of the first and third sub-intervals, and the discharging switch connects the input capacitor during one of the second and fourth sub-intervals.

13 Claims, 5 Drawing Sheets

SWITCHED-CAPACITOR ONE-BIT DIGITAL-TO-ANALOG CONVERTER WITH LOW SENSITIVITY TO OP-AMP OFFSET VOLTAGE

FIELD OF THE INVENTION

The present invention relates to digital-to-analog converters ("DACs") and, more particularly, to switched-capacitor DACs including circuitry for reducing operational amplifier ("op amp") offset voltage non-linearity errors.

BACKGROUND OF THE INVENTION

Sigma-delta analog-to-digital converters ("ADCs") and DACs have recently come into widespread use with the development of suitable process technology and the increase in digital audio and other applications. Sigma-delta converters utilize oversampling techniques (i.e., sampling at rates greater than the Nyquist rate) to achieve high signal-to-noise ratios. Such converters also exhibit excellent linearity. Additionally, sigma-delta converters are relatively straight-forward and inexpensive to implement due to their simplicity.

A sigma-delta ADC converts an analog input voltage to digital output samples at a predetermined rate. A typical sigma-delta ADC includes a front-end modulator which, by performing an oversampling technique referred to as "noise shaping", manipulates the noise spectrum signal such that a major component of the quantization noise power is shifted to a frequency range higher than the upper frequency limit of the band of interest, which is typically the signal bandwidth (within the output samples). Subsequent filtering ("decimation") is performed in the digital domain to reduce the high frequency quantization noise component of the digital output samples.

A conventional, first order sigma-delta ADC is shown in block diagram form in FIG. 1. The ADC includes a modulator 50 and a decimator 59. Modulator 50 converts an input voltage Vin, received on line 70, into a one-bit data stream X at a rate determined by the sampling frequency $Kf_s$. Modulator 50 performs oversampling and noise shaping on the input voltage. The one-bit data stream X is provided on line 57 to decimator 59 which low-pass filters the data stream to reduce the quantization noise component thereof, and provides filtered N-bit output samples at a rate $f_s$ on output line(s) 61. In short, the decimator 59 decimates, by a factor K, the one-bit data stream X.

The modulator 50 includes an input circuit 51 which samples the input signal Vin and provides the sampled input signal to a summing circuit 54. Summing circuit 54 subtracts a feedback signal (described below), received on line 65, from the sampled input signal and provides the output signal difference on line 55 to an integrator 56. Integrator 56 conventionally "integrates" the output signal difference from the summing circuit 55 and provides an output signal A to a clocked, latched comparator 58. Summing circuit 54 can generally be considered as an input section of the integrator. Comparator 58 conventionally is clocked at a rate $Kf_s$ by a clock signal applied to line 58A. For each clock pulse, comparator 58 "compares" signal A to ground and provides a one-bit output. The sequence of outputs for a sequence of clock pulses form on line 57 the one-bit data stream output X of the modulator. Thus, comparator 58 is effectively a one-bit ADC.

Data stream X is also provided on feedback line 63 to a feedback circuit 52, which includes a one-bit DAC (not shown). The stream X controls a switch 53 within the feedback circuit 52 such that either a positive feedback reference voltage +Vref, received on line 74, or a negative feedback reference voltage −Vref, received on line 76, will be applied, for each bit in stream X, via feedback line 65, to circuitry 66, which generates and supplies a corresponding feedback signal to the summing circuit 54. This switching operation of the feedback circuit 52 of the modulator 50 is conventional for a closed-loop circuit and should be readily understood by those skilled in the art.

Sigma-delta modulators are typically implemented with switched-capacitor circuits. While the operation of the modulator was generally described above in terms of delivering signals, in a switched-capacitor implementation, the signals are packets of charge. Thus, a charge packet is developed each time the input signal is sampled and each time a feedback signal is generated, with such charges or the net charge being "transferred" from the input and feedback circuits to the integrator via the summing circuit.

In a switched-capacitor implementation, the integrator 50 typically includes an op amp and a feedback-connected integrator capacitor (not shown in FIG. 1). The input and feedback circuits typically include switches and capacitors for respectively sampling the input and feedback reference voltages. During operation, an input capacitor is typically charged by a voltage source (i.e., the input voltage source or feedback reference voltage source) through a first switch (or switches) during a first time interval (clock phase), and charge is thereafter "transferred" through a second switch (or switches) from the input capacitor to the feedback-connected integrator capacitor during a second, non-overlapping time interval. The switches often include CMOS transistors due to their high performance and yield.

It should be appreciated by those skilled in the art that, as used in the art and herein, charge "transfer" refers to a charging of the integrator capacitor C3 by the integrator output voltage to compensate for charging (sampling) of the input capacitor C1 due to the equipotential surface between one plate of the input capacitor C1 and one plate of the integrator capacitor C3 (see FIG. 2). Thus, a literal, physical movement of charge from the input capacitor to the integrator capacitor may not occur.

The above description of the modulator, in which a single input voltage is sampled (with respect to ground), assumes the integrator 11 based on use of a single-ended op amp. As will be understood by those skilled in the art, however, the integrator may include a differential amplifier for which positive and negative input voltages are separately sampled.

Whether single-ended or differential, CMOS op amps typically have associated input offset voltages within the range of 1–10 mv (whereas ideally the input offset voltage should be 0). During operation, the difference between the voltages on the input terminals of a differential op amp will be equal to the input offset voltage, when the output voltage is at 0 volts.

In sigma-delta ADC modulators, the input offset voltage of the op amp may charge the feedback circuit capacitor(s) (i.e., the offset voltage is sampled by the feedback circuit) and that charge may be "transferred" to the integrator. Ideally, the only charge transferred from the feedback circuit should be that due to the sampled feedback reference voltages. As will be appreciated by those skilled in the art, the amount of charge transferred from the feedback circuit to the integrator is typically controlled by the transition density (i.e., the number of transitions from 1 to 0 or from 0 to 1) of the digital output signal (X in FIG. 1) of the modulator. Because the transition density of the digital output signal is typically non-linear, the transfer of charge resulting from sampling the input offset voltage is also non-linear. As a result of the non-linear transfer of charge due to the sampling of the input offset voltage, such modulators may suffer from integral non-linearity performance inaccuracies and encounter repetitive noise patterns known as "idle tones". The following is a detailed discussion of such prior art modulator performance.

Referring to FIG. 2, where like elements are referred to by identical reference characters to those of FIG. 1, a prior art switched-capacitor DAC system is shown including a DAC 52 and an integrator 56. During operation, the DAC 52 samples the reference voltage Vref and transfers charge corresponding to +Vref or −Vref to the integrator 56. The reference voltage Vref can be considered an input voltage to the DAC.

Integrator 56 includes an op amp 60, a first integrator capacitor C3 connected between non-inverting output lead 66 and inverting input lead 62 of the op amp, and a second integrator capacitor C4 connected between inverting output lead 68 and non-inverting input lead 64.

The switched-capacitor DAC 52 includes input lines 74 and 76 respectively receiving the positive and the negative terminals of the reference voltage Vref. A first input capacitor C1 is coupled to the input lines 74 and 76 through a first switching circuit 78 and to the input leads of the op amp through a second switching circuit 80. A second input capacitor C2 is similarly coupled to the input lines 74 and 76 through the first switching circuit 78 and to the input leads 62 and 64 of the op amp through the second switching circuit 80. Capacitors C1 and C2 sample (i.e., are charged by) the reference voltage Vref through switching circuit 78 and transfer charge to capacitors C3 and C4 through switching circuit 80. The values of capacitors C1 and C2 are preferably equal as are the values of capacitors C3 and C4.

Switching circuit 78 includes switches labeled with the symbol P1 or P2. The switches labeled P1 are controlled by the control signal P1 and the switches labeled P2 are controlled by the control signal P2 (see FIG. 3). Switching circuit 80 includes switches labeled with the symbol R1 or R2. The switches labeled R1 are controlled by the control signal R1 and the switches labeled R2 are controlled by the control signal R2 (see FIG. 3).

Shown in the timing diagram of FIG. 3 are the control signals P1, P2, R1 and R2 as well as the digital input signal Y used to generate signals R1 and R2. In a sigma-delta ADC modulator application, signal Y is typically the digital output signal (i.e., signal X in FIG. 1). The control signals are shown on the same time axis and the vertical placement of one above the other does not signify that one attains different voltage levels than the other; the "high" and "low" voltage levels of the signals are relative to each other only. As is conventional for a switched-capacitor circuit, the P1 and P2 switches operate in two non-overlapping time intervals (or clock phases). During interval 1 (marked on the time axis), signal P1 is at a high voltage level and signal P2 is at a low voltage level. During interval 2, signal P1 is low and signal P2 is high.

Signal P1 controls the switches labeled P1 such that during interval 1 (when P1 is high), the P1 labeled switches are closed (and conduct current) and, during interval 2 (when P1 is low), the P1 labeled switches are open (and prevent the flow of current). Conversely, the switches labeled P2 are open during interval 1 and are closed during interval 2. It is important that the signals P1 and P2 are not high at the same time so that accurate reference voltage sampling occurs. Thus, as will be understood by those skilled in the art, the circuit (not shown) generating signals P1 and P2 typically establishes a "break-before-make" operation to ensure that the control signals are not simultaneously high.

The control signals R1 and R2 depend on the level of the signal Y in accordance with the following relationships. R1=P1·YB+P2·Y and R2=P1·Y+P2·YB, where YB is the complement of Y, "+" represents a logical OR operation and "·" represents a logical AND operation. When Y is low, signal R1 is identical to signal P1 and signal R2 is identical to signal P2. When Y is high, signal R1 is identical to signal P2 and signal R2 is identical to signal P1.

Referring back to FIG. 2, switching circuit 78 includes a first switch S1 connected between input line 74 and the left plate of capacitor C1, a second switch S2 connected between input line 76 and the left plate of capacitor C1, a third switch S3 connected between input line 76 and the left plate of capacitor C2, and a fourth switch S4 connected between input line 74 and the left plate of capacitor C2. Switching circuit 80 includes a first switch S5 connected between the right plate of capacitor C1 and the inverting input lead 62 of op amp 60, a second switch S6 connected between the right plate of capacitor C1 and the non-inverting input lead 64, a third switch S7 connected between the right plate of capacitor C2 and the non-inverting input lead 64, and a fourth switch S8 connected between the right plate of capacitor of C2 and the inverting input lead 62. As labeled, switches S1 and S3 are controlled by control signal P1, switches S2 and S4 are controlled by control signal P2, switches S6 and S8 are controlled by control signal R1, and switches S5 and S7 are controlled by control signal R2.

As should be readily understood by those skilled in the art, the input capacitors C1 and C2 operate to sample the reference voltages through switching circuit 78 and to transfer charge to the integrating capacitors C3 and C4 through the switching circuit 80. The cross-coupled arrangement of the input capacitors enables the reference voltages to be sampled during both time intervals and charge to be transferred during both time intervals. The timing diagram of FIG. 3 assumes that signal Y transitions once during intervals 1 and 2 and that the transition occurs between interval 2 and interval 1.

While the prior DAC of FIG. 2 operates effectively to sample the reference voltages during both time intervals and to transfer charge to the integrating capacitors during both time intervals, the DAC may produce integral non-linearity errors due to the presence of an op amp input offset voltage. FIG. 4 schematically illustrates the prior art DAC of FIG. 2 for the situation where the reference voltages are equal to 0 volts (i.e., the input lines 74 and 76 are tied to ground) and the op amp 70 has an associated input offset voltage $V_{OS}$, so that the effect of the input offset voltage can be more easily analyzed.

Such an analysis follows.

During interval 1, assuming signal Y is low, the left plate of capacitor C1 is connected to ground through switch S1 and the right plate of capacitor C1 is connected through switch S6 to the non-inverting input lead 64 which is at a voltage level of $-V_{OS}/2$. [The common-mode voltage of the input leads of the op amp is assumed to be 0 volts. Therefore, the inverting input lead 62 is at a voltage level of $+V_{OS}/2$ and the non-inverting input lead 64 is at a voltage level of $-V_{OS}/2$.] During the immediately following interval 2, assuming that Y does not transition from low to high, the left plate of capacitor C1 is connected to ground through switch S2 and the right plate of capacitor C1 is connected through switch S5 to inverting input lead 62 (which is at a voltage level of $V_{OS}/2$). Thus, a total charge (related to the change in voltage on the right plate of capacitor C1) of $C1 \cdot V_{OS}$ has accumulated on capacitor C1 during the two intervals and that same charge of $C1 \cdot V_{OS}$ is transferred to capacitor C3. As will be appreciated by those skilled in the art, an equal and opposite charge will be transferred from capacitor C2 to capacitor C4 due to the differential arrangement of the circuitry and the capacitors C1 and C2 being of equal value. Therefore, the charging of capacitor C2 and the transfer of charge from capacitor C2 to C4 will not be separately analyzed. In sum, if signal Y remains low (does not transition), a charge equal to $C1 \cdot V_{OS}$ is transferred to the integrator capacitor C3 during the second of two consecutive intervals.

However, when signal Y transitions between two consecutive intervals, the right hand plate of the input capacitor remains connected to the same node and no charge is transferred, as described below. During interval 2 (assuming Y is low), the left plate of capacitor C1 is connected through switch S2 to ground and the right plate of capacitor C1 is connected through switch S5 to the inverting input lead 62 (at a voltage level of $V_{OS}/2$). During the subsequent interval 1 (assuming Y transitions to high), the left plate of capacitor C1 is connected to ground through switch S1 and the right plate of capacitor C1 remains connected through switch S5 to the inverting input lead 62. Thus, the voltage on the right plate of capacitor C1 does not change between intervals 2 and 1 and no charge is transferred. In sum, if Y does not transition between two consecutive time intervals, then a charge of $C1 \cdot V_{OS}$ is transferred and if Y does transition between the time intervals, then no charge is transferred.

The total charge transferred due to the input offset voltage of the op amp over a period of time, therefore, depends on the density of transitions in the signal Y. In a sigma-delta ADC modulator, the transition density in the output signal (Y) is typically non-linear. FIG. 5 is a graph illustrating the transition density for a digital output signal of a second-order sigma-delta ADC modulator over an analog input voltage range of $-1$ volt to $+1$ volt. As shown, the transition density is approximately equal to 70 percent for mid-scale code (i.e., 0 volts) and is approximately equal to 25 percent for positive and negative full-scale code (i.e., $\pm 1$ volts). As a result, a sigma-delta ADC modulator employing the prior art DAC of FIG. 2 may encounter integral non-linearity accuracy problems and idle tones.

Accordingly, a general object of the present invention is to provide a high-performance switched-capacitor DAC including circuitry for reducing op amp offset voltage non-linearity errors.

Other objects and advantages will be apparent from the detailed description below.

SUMMARY OF THE INVENTION

The aforementioned drawbacks of the prior art are overcome by a method and apparatus of the present invention in which a switched-capacitor input circuit charges an input capacitor with an input voltage during sampling time intervals and transfers charge from the input capacitor to an integrator capacitor during transferring time sub-intervals. One plate of the input capacitor is connected through a transferring switch to an input lead of the op amp during the transferring time sub-intervals. That plate of the input capacitor is connected through a discharge switch to a discharge node during discharging time sub-intervals to discharge offset voltage charge accumulated on the input capacitor during a previous transferring sub-interval.

More particularly, in accordance with the preferred embodiment of the present invention, a switched-capacitor DAC system includes an integrator circuit including an op amp having an input lead, an output lead and an integrator capacitor connected between the input lead and the output lead. A switched-capacitor DAC includes an input capacitor connectable through a sampling switch to be charged by an input voltage at a sample rate and connectable through a transferring switch to transfer charge from the input capacitor to the integrator capacitor at a transfer rate. The DAC further includes a discharge switch for connecting the input capacitor to a discharge node at a predetermined rate related to the transfer rate such that any charge transfer due to op amp offset voltage will be substantially independent of any non-linearities in the transfer rate.

In one embodiment of the present invention, the input capacitor is charged by the input voltage during first and second non-overlapping time intervals. The first time interval is subdivided into first and second non-overlapping sub-intervals and the second time interval is subdivided into third and fourth non-overlapping sub-intervals. Charge is transferred from the input capacitor to the integrator capacitor during the first and third sub-intervals, and the input capacitor is connected to the discharge node during either the second or fourth sub-intervals.

In another embodiment of the present invention, the input capacitor is connected to the discharge node during both the second and fourth sub-intervals.

DETAILED DESCRIPTION

By contrast with prior art switched-capacitor DAC systems in which the amount of input offset voltage charge transferred from an input capacitor to an integrating capacitor is dependent upon the transition density of the input control signal which is used to generate the control signals for controlling the transfer switches, the amount of charge (due to the input offset voltage) transferred from the input capacitor to the integrating capacitor in the DAC system of the present invention is independent of the transition density of the input control signal. In a preferred embodiment of the present invention, one plate of the input capacitor is periodically connected to a discharge node at a known voltage (e.g., ground), to discharge charge build-up on the input capacitor due to op amp input offset voltage before charge is transferred from the input capacitor to the integrating capacitor.

Figure 6:
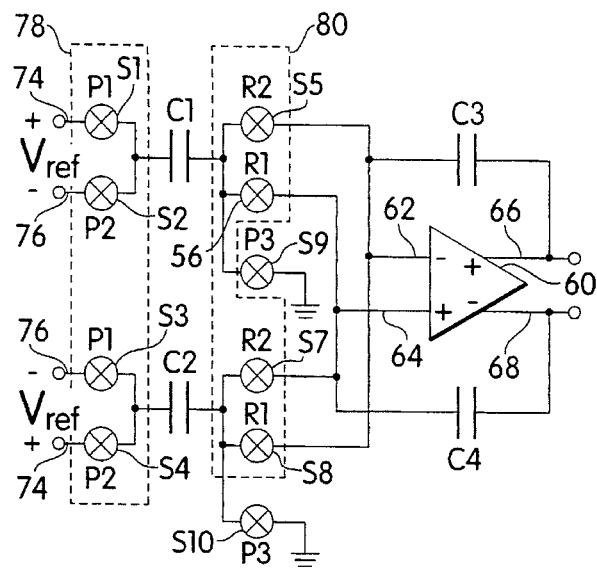
FIG. 6 is a schematic diagram of a DAC system according to the present invention.

FIG. 6 is a schematic diagram of a first embodiment of a switched-capacitor DAC circuit according to the present invention which ensures that the amount of charge transferred due to the input offset voltage will be independent of the transition density of digital input signal Y. Thus, the DAC circuit of the present invention is immune to the non-linear transition density of signal Y.

Figure 1:
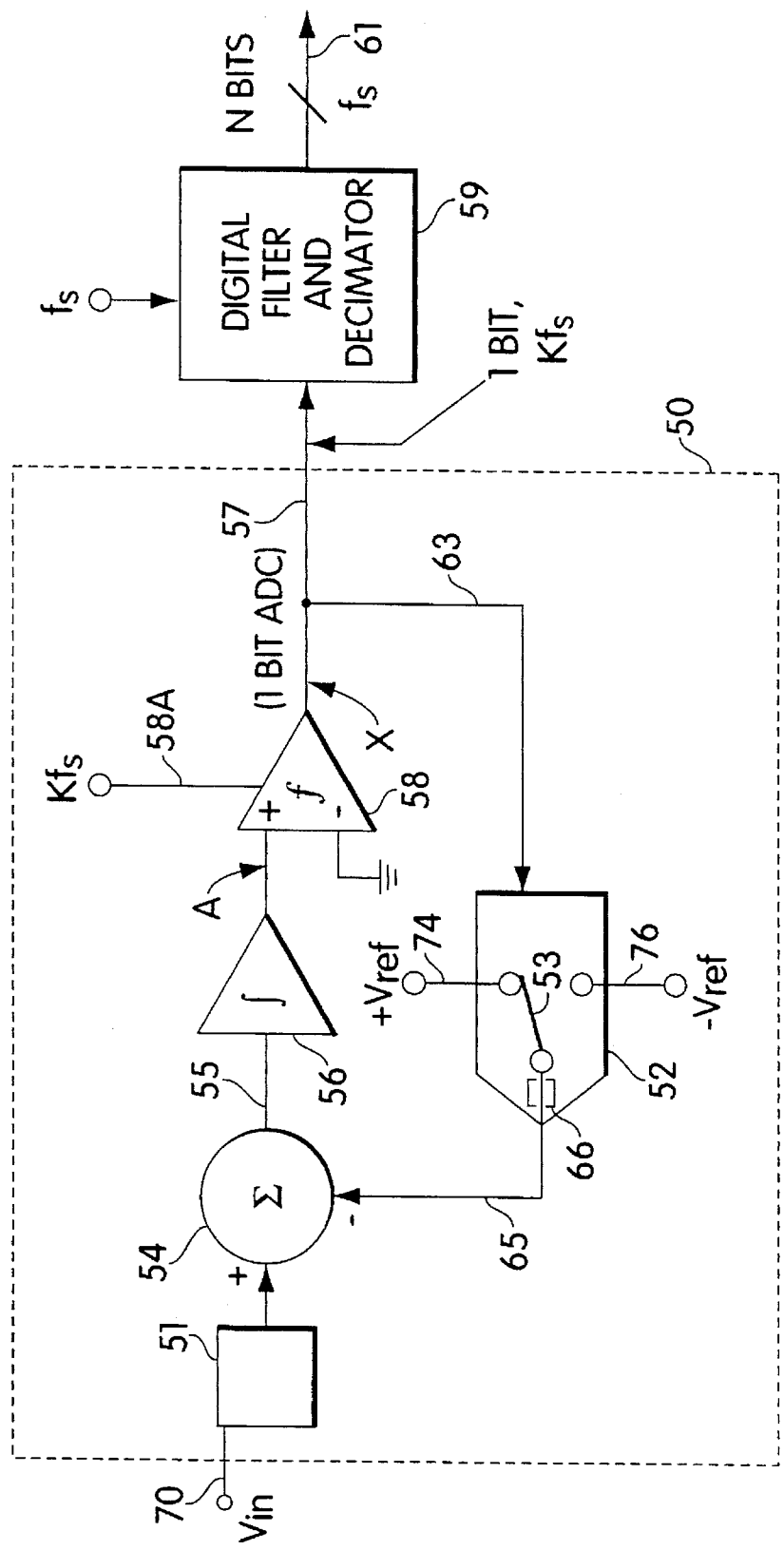
FIG. 1 is a block diagram of a prior art sigma-delta ADC system.
Figure 2:
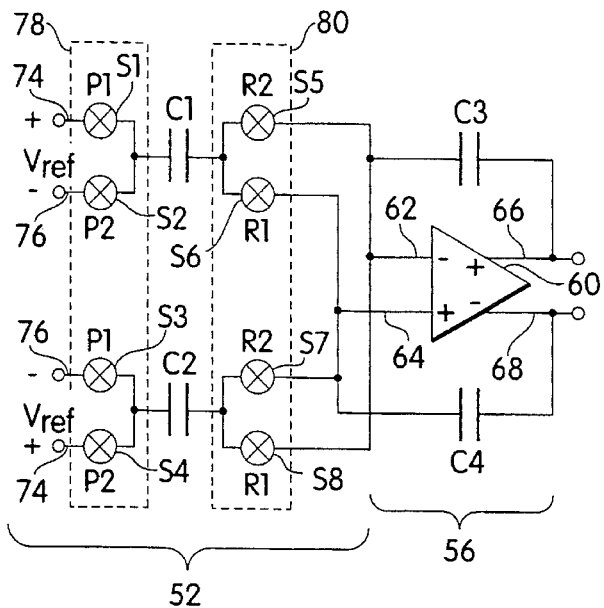
FIG. 2 is a schematic diagram of a prior art switched-capacitor DAC system.
Figure 3:
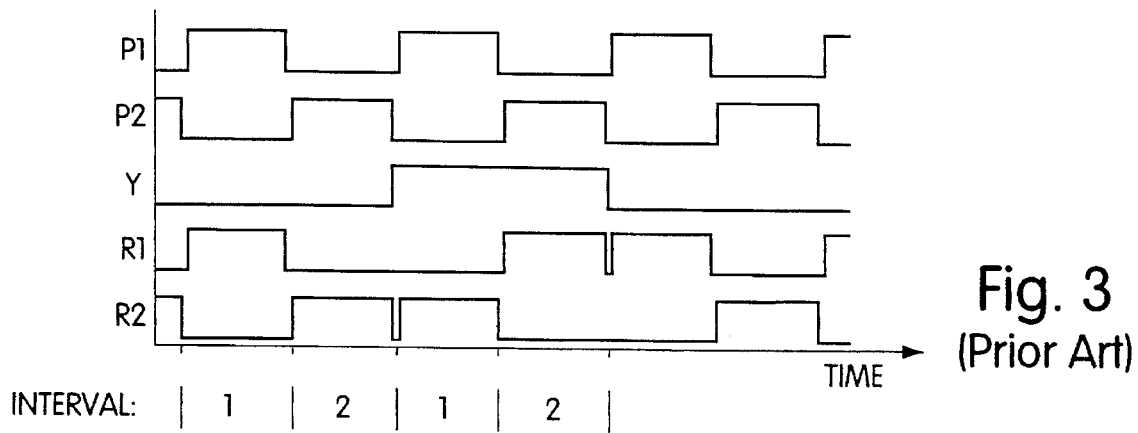
FIG. 3 is a timing diagram of the control signals which control operation of the switches within the DAC system of FIG. 2.
Figure 4:
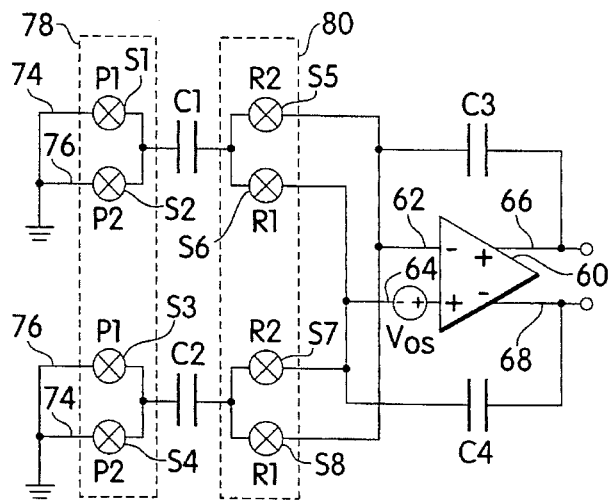
FIG. 4 is a schematic diagram of the DAC system of FIG. 2 illustrating the op amp input offset voltage for a particular DAC input voltage.
Figure 5:
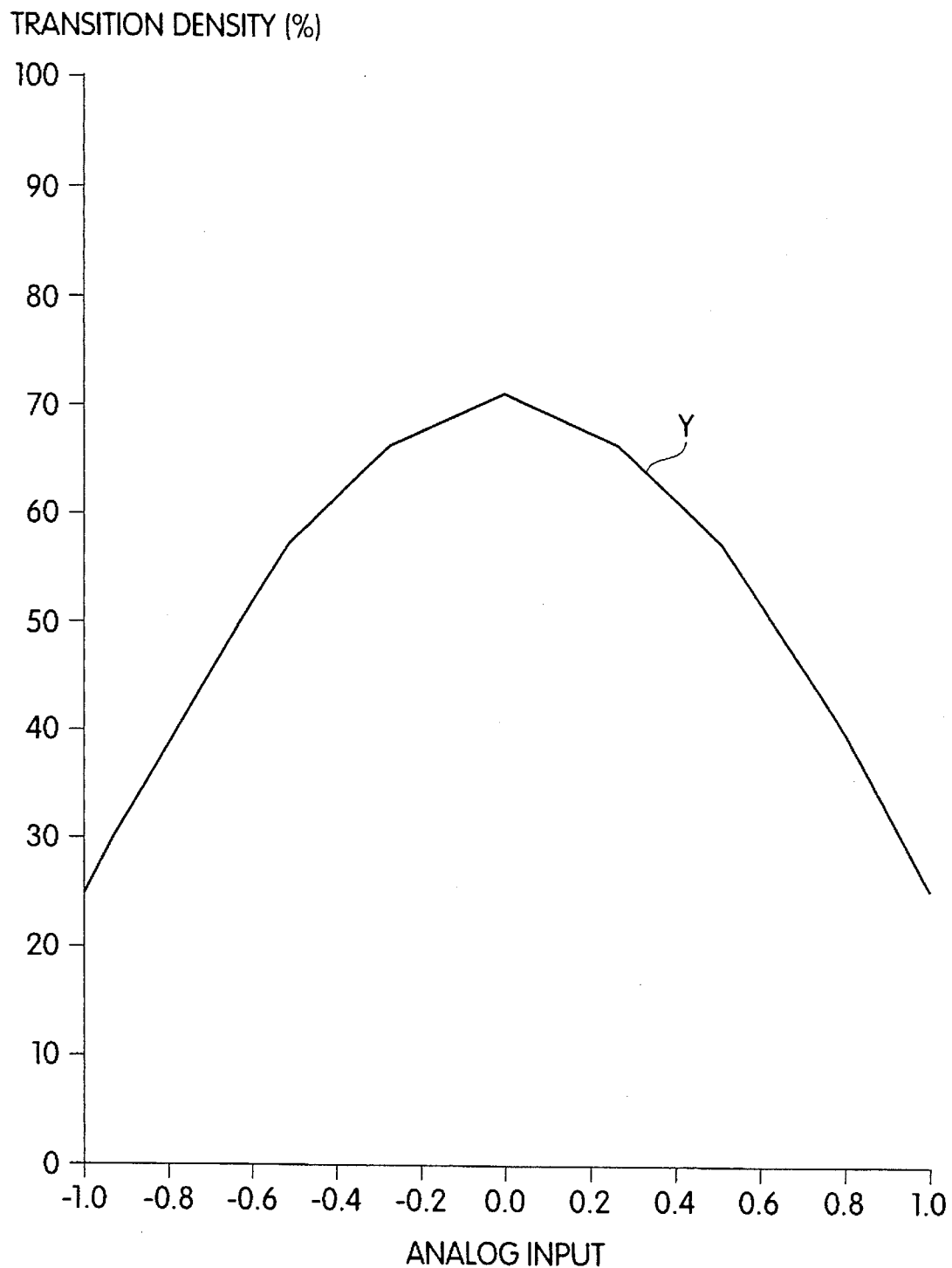
FIG. 5 is a graph of the transition density of a typical digital output signal of a second-order sigma-delta ADC modulator.

The DAC circuit of FIG. 6 is identical to the prior art DAC circuit of FIG. 2 except for the addition of switches S9 and S10. Switch S9 is connected between the right plate of capacitor C1 and a reference voltage such as ground, and switch S10 is connected between the right plate of capacitor C2 and the same reference voltage. The operation of switches S9 and S10 is controlled by the periodic control signal P3, shown in the timing diagram of FIG. 7. Switch S9 operates to periodically connect the right plate of capacitor C1 to ground to discharge charge accumulation on capacitor C1 due to the input offset voltage of the op amp. Switch S10 operates similarly with respect to capacitor C2.

Figure 7:
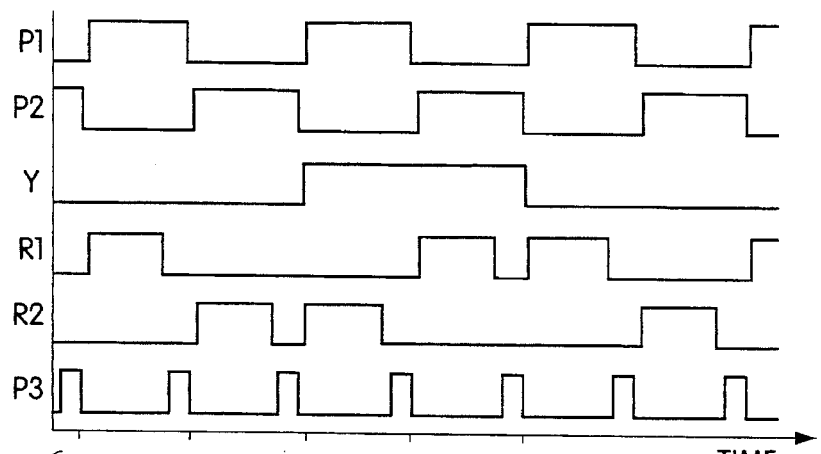
FIG. 7 is a timing diagram of the control signals which control operation of the switches within the DAC system of FIG. 6.

As shown in the timing diagram of FIG. 7, each of the intervals 1 and 2 is subdivided into two sub-intervals. Interval 1 includes sub-intervals A and B, and interval 2 includes sub-intervals C and D. Control signals R1 and R2 are governed by the following equations. R1=P1S·YB+P2S·Y and R2=P1S·Y+P2S·YB, where P1S is similar to signal P1 but with a shortened high duration and signal P2S is similar to signal P2 but with the same shortened high duration. If signal Y is low, signal R1 is high for sub-interval A and is low for sub-interval B and signal P3 is low during sub-interval A and is high during sub-interval B. Similarly, if Y is low, signal R2 is high during sub-interval C and is low during sub-interval D and signal P3 is low during sub-interval C and is high during sub-interval D. If Y is high, signals R1 and R2 are reversed. It is important that signal P3 is not simultaneously high with signal R1 or R2. Thus, the circuit (not shown) which generates such control signals applies appropriate break-before-make operations.

Figure 8:
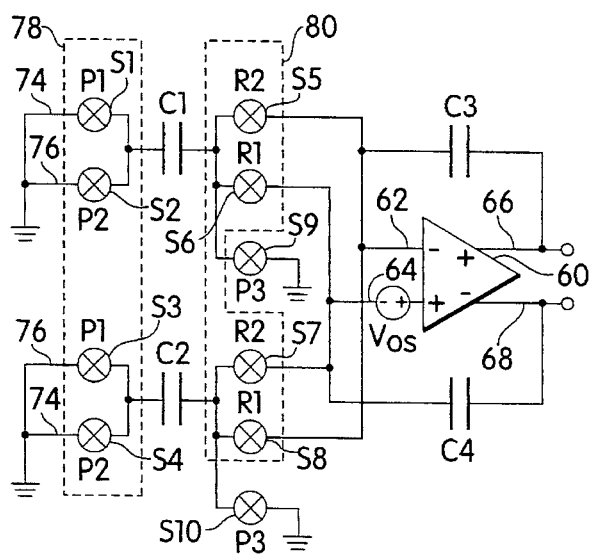
FIG. 8 is a schematic diagram of the DAC system of FIG. 6 illustrating the op amp input offset voltage for a particular DAC input voltage.

FIG. 8 illustrates the switched capacitor DAC of the present invention having input voltages of 0 volts (i.e., with the input lines tied to ground) and an operational amplifier input offset voltage $V_{OS}$, so that the effect of the input offset voltage can be more easily analyzed. Such an analysis follows.

During interval 2, sub-interval C, assuming signal Y is low, the left plate of capacitor C1 is connected to ground through switch S2 and the right plate of capacitor C1 is connected through switch S5 to the inverting input lead 62. The right plate of capacitor C1 is therefore at a voltage level of $+V_{OS}/2$. Thus, capacitor C1 will charge to a value of $-C1 \cdot V_{OS}/2$. During interval 2, sub-interval D, the left plate of capacitor C1 is still connected through switch S2 to ground and the right plate of capacitor C1 is connected through switch S9 to ground. Thus, the charge of $-C1 \cdot V_{OS}/2$ on capacitor C1 will be discharged. During the subsequent interval 1, sub-interval A, assuming signal Y does not transition, the left plate of capacitor C1 will be connected through switch S1 to ground and the right plate of capacitor C1 will be connected through switch S6 to the non-inverting input lead 64. The right plate of capacitor C1 will therefore be at a voltage level of $-V_{OS}/2$ and capacitor C1 will charge to $C1 \cdot V_{OS}/2$. Thus, a charge of $C1 \cdot V_{OS}/2$ will be transferred to integrating capacitor C4 (and due to the differential arrangement of the op amp and DAC circuit, an equal and opposite charge of $-C1 \cdot V_{OS}/2$ will be transferred from input capacitor C2 to integrating capacitor C3).

If, instead, signal Y had transitioned between interval 2 and interval 1, the same charge would be transferred during interval 1, as discussed below. The charge on capacitor C1 would still be discharged during interval 2, sub-interval D. However, during the subsequent interval 1, sub-interval A, the right plate of capacitor C1 would be connected through switch S5 to the inverting input lead 62. The right plate of capacitor C1 would therefore be at a voltage level of $+V_{OS}/2$ and capacitor C1 would charge to $-C1 \cdot V_{OS}/2$. Thus, a charge of $-C1 \cdot V_{OS}/2$ would be transferred to capacitor C3 (with an equal and opposite charge of $C1 \cdot V_{OS}/2$ being transferred to capacitor C4) which is the same as that transferred without signal Y transitioning (discussed above). Thus, the only charge (due to the input offset voltage) transferred during a transferring time sub-interval is that sampled during the same transferring sub-interval. The circuit operates to discharge charge accumulation (due to the input offset voltage) from a previous transferring time sub-interval so that the input capacitors have no "memory" of the previous transferring sub-interval.

In sum, as shown and described, the amount of charge (due to the input offset voltage) transferred from the input capacitors to the integrating capacitors is independent of the transition density of the control signal Y. Accordingly, a sigma-delta ADC modulator employing the DAC circuit of the present invention would not suffer from the offset voltage non-linearity problems of the prior art.

Figure 9:
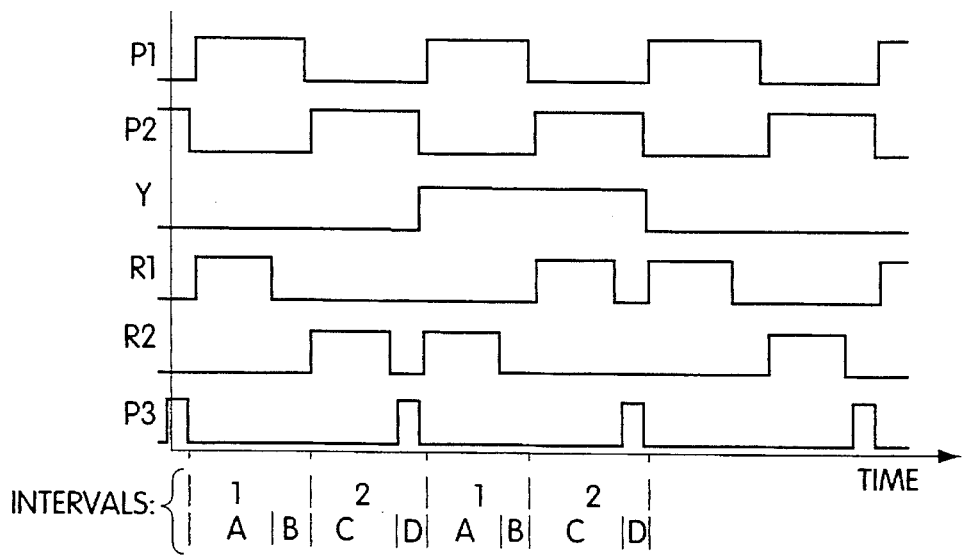
FIG. 9 is an alternate embodiment timing diagram of the control signals which control operation of the switches within the DAC system of FIG. 6.

Assuming that the control signal Y can transition only once during intervals 1 and 2 (which is typical for a sigma-delta ADC modulator), it is only necessary to close switches S9 and S10 once before each possible transition of signal Y. Thus, an alternate embodiment timing diagram of the control signals is shown in FIG. 9. As shown, signal P3 is only high once during intervals 1 and 2 (i.e., in sub-interval D) before the transition of signal Y. As will be appreciated by those skilled in the art, however, the phase of the control signal Y may vary with respect to the control signals P1 and P2, depending on the application and the switched-capacitor circuit. Thus, the timing diagram of the control signal P3 can be varied accordingly, provided that the control signal P3 goes high (i.e., switches controlled by P3 are closed) once before each possible transition of signal Y.

Additionally, as those skilled in the art will appreciate, for a "chopper-stabilizer" DAC circuit, in which the connections of the input leads of the op amp are interchanged (reversed) during each interval in order to cancel completely the effect of the input offset voltage, the timing diagram of FIG. 7 must be used to effectuate that cancelling.

Figure 10:
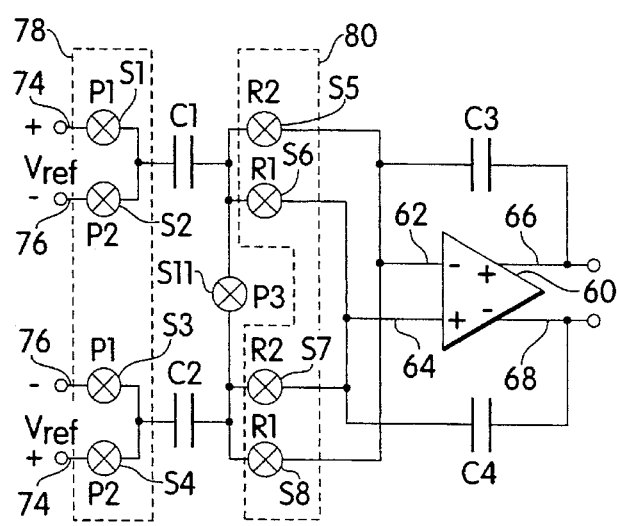
FIG. 10 is a schematic diagram of an alternate embodiment DAC system according to this invention.

FIG. 10 is a schematic diagram of an alternate embodiment of the DAC circuit of the present invention. In the embodiment of FIG. 10, the right plate of capacitor C1 is connected through switch 11 to the right plate of capacitor C2 and switch S11 is controlled by control signal P3. Assuming that the value of capacitor C1 is equal to the value of capacitor C2, the charge accumulated on capacitor C1 due to the input offset voltage will be equal and opposite to that accumulated on capacitor C2. Therefore, when the right plates of the capacitors are connected together through switch 11, the charge on the capacitors will effectively cancel one another. Thus, the circuit of FIG. 10 effectively operates identically to that of FIG. 6. As those skilled in the art will readily appreciate, however, the advantage of the FIG. 6 embodiment, in which the right plate of the capacitors are connected to a fixed voltage, is that the fixed voltage serves as a common-mode reference voltage for the op amp and will aid in dynamically correcting any tendency for the common-mode voltage to drift.

While there have been shown and described what are at present considered the preferred embodiments for the present invention, which have been disclosed by way of example only, it would be obvious to those skilled in the art that various changes and modifications can be made therein without departing from the spirit and scope of the invention as presented above and as defined by the appended claims and equivalents thereto. Particularly, while specific switching arrangements and timing control patterns have been disclosed, others are envisioned which effectuate a transfer of offset voltage charge independent of any non-linearities in the input control signal. In addition, while the DAC of the present invention has been shown an described as being used in a sigma-delta ADC application which includes an integrator, the DAC of of the present invention may alternatively be connected to a switched-capacitor gain stage.

What is claimed is:

1. A switched-capacitor DAC system for use with a sigma-delta ADC modulator having an integrator circuit including an op amp having first and second input leads, first and second output leads and first and second integrator capacitors respectively connected between the first and second input leads and the first and second output leads, the DAC system comprising:

an input capacitor;

a sampling switch operable to connect the input capacitor to be charged by an input voltage during at least one of first and second non-overlapping time intervals, wherein the first time interval is subdivided into first and second non-overlapping sub-intervals and the second time interval is subdivided into third and fourth non-overlapping sub-intervals;

at least one transferring switch operable to connect the input capacitor to transfer charge from the input capacitor to the first integrator capacitor during the first sub-interval and to the second integrator capacitor during the third sub-interval; and a discharging switch operable to connect the input capacitor to a discharge node during at least one of the second and fourth sub-intervals.

2. A DAC as claimed in claim 1, wherein the discharging switch connects the input capacitor during one of the second and fourth sub-intervals.

3. A DAC as claimed in claim 2, wherein the discharging switch connects the input capacitor during both the second and fourth sub-intervals.

4. The DAC system as claimed in claim 1 further including a second input capacitor.

5. A switched-capacitor DAC system for use with a sigma-delta ADC modulator having an integrator circuit including an op amp having first and second input leads, first and second output leads and first and second integrator capacitors respectively connected between the first and second input leads and the first and second output leads, the DAC system comprising:

an input capacitor;

sampling switch means for connecting the input capacitor to be charged by an input voltage during at least one of first and second non-overlapping time intervals, wherein the first time interval is subdivided into first and second non-overlapping sub-intervals and the second time interval is subdivided into third and fourth non-overlapping sub-intervals;

transferring switch means for connecting the input capacitor to transfer charge from the input capacitor to the first integrator capacitor during of the first sub-interval and to the second integrator capacitor during the third sub-interval; and discharging switch means for connecting the input capacitor to a discharge node during at least one of the second and fourth sub-intervals.

6. A DAC as claimed in claim 4, wherein the discharging switch means connects the input capacitor during one of the second and fourth sub-intervals.

7. A DAC as claimed in claim 5, wherein the discharging switch means connects the input capacitor during both the second and fourth sub-intervals.

8. The DAC system as claimed in claim 5, further including a second input capacitor.

9. A method for converting a digital signal to an analog signal comprising the steps of:

connecting the input capacitor to be charged by an input voltage during at least one of first and second non-overlapping time intervals, wherein the first time interval is subdivided into first and second non-overlapping sub-intervals and the second time interval is subdivided into third and fourth non-overlapping sub-intervals;

connecting the input capacitor to transfer charge from the input capacitor to a first integrator capacitor during the first subinterval and to a second integrator capacitor during the third sub-interval; and connecting the input capacitor to a discharge node during at least one of the second and fourth sub-intervals.

10. A method as claimed in claim 9 wherein the step of connecting the input capacitor to a discharge node includes the step of connecting the input capacitor to a discharge node during one of the second and fourth sub-intervals.

11. A method as claimed in claim 10 wherein the step of connecting the input capacitor to a discharge node includes the step of connecting the input capacitor to a discharge node during both the second and fourth sub-intervals.

12. A switched-capacitor DAC system, the DAC system coupled to a switched-capacitor gain circuit having first and second gain capacitors, the DAC system comprising:

an input capacitor;

a sampling switch operable to connect the input capacitor to be charged by an input voltage during at least one of first and second non-overlapping time intervals, wherein the first time interval is subdivided into first and second non-overlapping sub-intervals and the second time interval is subdivided into third and fourth non-overlapping sub-intervals;

at least one transferring switch operable to connect the input capacitor to transfer charge from the input capacitor to the first gain capacitor during the first sub-interval and to the second gain capacitor during the third sub-interval; and a discharging switch operable to connect the input capacitor to a discharge node during at least one of the second and fourth sub-intervals.

13. The DAC system as claimed in claim 12 further including a second input capacitor.

* * * * *